(12) United States Patent
Brown et al.

(10) Patent No.: US 6,218,222 B1
(45) Date of Patent: Apr. 17, 2001

(54) METHOD OF MANUFACTURING A SEMICONDUCTOR DEVICE WITH A SCHOTTKY JUNCTION

(75) Inventors: Adam R. Brown; Wiebe B. De Boer, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/141,644

(22) Filed: Aug. 27, 1998

(30) Foreign Application Priority Data

Sep. 3, 1997 (EP) .................................................. 97202711

(51) Int. Cl.⁷ .................................................. H01L 21/338
(52) U.S. Cl. .................... 438/167; 438/167; 438/570; 257/260; 257/280; 257/281
(58) Field of Search ..................... 438/167, 570; 257/260, 280

(56) References Cited

U.S. PATENT DOCUMENTS

| | | | |
|---|---|---|---|
| 3,846,192 | * 11/1974 | Murrmann | 148/175 |
| 4,089,020 | 5/1978 | Ikeda et al. | 357/15 |
| 4,260,431 | * 4/1981 | Pitrowski | 148/1.5 |
| 4,310,362 | * 1/1982 | Roche et al. | 148/1.5 |
| 4,326,211 | * 4/1982 | Smeets | 357/30 |
| 4,481,041 | * 11/1984 | Muller | 148/1.5 |
| 5,336,626 | * 8/1994 | Lee | 437/39 |
| 5,459,089 | * 10/1995 | Baliga | 437/40 |
| 5,475,257 | * 12/1995 | Hashimoto te al. | 257/587 |
| 5,484,740 | * 1/1996 | Cho | 437/40 |

* cited by examiner

*Primary Examiner*—Matthew Smith
*Assistant Examiner*—Granvill Lee
(74) *Attorney, Agent, or Firm*—Steven R. Biren

(57) ABSTRACT

Devices with Schottky junctions are manufactured in that a semiconductor body with a substrate is provided with a first, for example n-type semiconductor region in the form of an epitaxial layer. A Schottky metal is locally provided thereon. A second semiconductor region is advantageously formed directly below the Schottky metal, with the purpose of adjusting the level of the Schottky barrier. Around this, a third semiconductor region is formed in the first region at at least two sides, which third region is then of the p-conductivity type and, when it entirely surrounds the second region, forms a so-called guard ring. A disadvantage of the above known method is that the devices obtained thereby have a (forward) current-voltage characteristic which is not very well controllable and reproducible. This hampers mass manufacture. To counteract this disadvantage, a method according to the invention provides the formation of the second semiconductor region by means of low-temperature gas phase epitaxy, such that it has the first or the second conductivity type, and the third region is formed by means of ion implantation, the second semiconductor region being formed after the third region has been formed. Devices are obtained thereby whose current-voltage characteristics can be adjusted over a wide range with very good reproducibility and well controlled. The second semiconductor region may be provided over the entire surface or selectively within the third region only.

10 Claims, 3 Drawing Sheets

METHOD OF MANUFACTURING A SEMICONDUCTOR DEVICE WITH A SCHOTTKY JUNCTION

BACKGROUND OF THE INVENTION

The invention relates to a method of manufacturing a semiconductor device with a rectifying Schottky junction, comprising a semiconductor body with a semiconductor substrate, by which method a stack is formed in the semiconductor body of a first semiconductor region of a first conductivity type formed by means of epitaxy and a second semiconductor region having a small thickness and a high doping concentration, and by which method a metal layer is provided on the semiconductor body at the area of the second semiconductor region so as to form the Schottky junction with the semiconductor body, and the thickness and doping concentration of the second semiconductor region are chosen such that the height of the Schottky barrier of the Schottky junction is influenced, while a third semiconductor region of a second conductivity type opposed to the first is provided from the surface of the semiconductor body into the first semiconductor region at at least two mutually opposed sides of the second semiconductor region.

Such a method is used for giving a Schottky barrier, wherever this is used, a current-voltage characteristic, especially in the forward direction, which is most suitable for the application. The use of a thin, strongly doped barrier layer renders possible a greater variation in said characteristic than is possible, for example, through the choice of different Schottky metals.

Such a method is known from U.S. Pat. No. 4,089,020. It is described therein (see FIG. 4) how a first n-type semiconductor region is formed as an epitaxial layer on an n-type silicon semiconductor substrate. In the semiconductor region thus formed, a thin, strongly doped second semiconductor region of p-type silicon is formed by means of implantation, acting as a layer which influences the barrier for a Schottky junction to be formed. This junction is provided with an annular third semiconductor region which embraces the second semiconductor region at at least two mutually opposed sides, entirely surrounding it in this case, which third region is formed from the surface of the semiconductor body through the local diffusion into it of p-type impurities and is provided with a doping concentration and a geometry such that leakage currents and breakdown at the edge of the Schottky junction to be formed are limited and prevented, respectively, acting as a so-called guard ring. A metal layer of aluminum, which forms a Schottky junction with the semiconductor body, is provided on the surface of the semiconductor body and in contact with the second semiconductor region. The substrate is provided with an ohmic contact.

A disadvantage of this method is that the properties of the devices obtained thereby, in particular the current-voltage characteristic, are not satisfactorily controllable and in addition not well reproducible. The known method is less suitable for mass manufacture on account of this.

SUMMARY OF THE INVENTION

It is an object of the invention to counteract said disadvantage and to provide a method which yields devices with well controllable and reproducible properties.

According to the invention, a method of the kind mentioned in the opening paragraph is for this purpose characterized in that the second semiconductor region is formed by means of low-temperature gas phase epitaxy and is given the first or second conductivity type, in that the third semiconductor region is formed by means of ion implantation, and in that the second semiconductor region is formed after the third semiconductor region has been formed. The invention is based on the surprising recognition that ion implantation is not the most suitable technique for forming the second semiconductor region, in particular if this region is very thin and strongly doped. A very low implantation energy is necessary for forming this region then, for example 5 to 15 keV. Such a low implantation energy is difficult to adjust and to reproduce. In addition, the use of ion implantation requires a subsequent heat treatment for activating the implantated ions electrically. It is necessary for this to bring the semiconductor body to, for example, 900° C. during 20 minutes. This is found to lead to an unacceptably great and badly controllable diffusion of the implanted ions, especially if a high doping concentration or a small thickness is chosen for the second semiconductor region, in particular when phosphorus ions are implanted. The invention is also based on the recognition that gas phase epitaxy is a more suitable alternative in these respects. This process can be carried out very well already at, for example, 700° C., and the growing time required for very thin layers—also at the comparatively low growing rates which accompany such a low growing temperature—is still limited to, for example, one to ten minutes (inclusive of heating-up and cooling-down). The fact that the third semiconductor region is formed by means of ion implantation instead of diffusion also reduces the thermal treatment of the semiconductor body required for the formation of this region. This benefits the sharpness of the interface between the epitaxial layer and the substrate.

Since ion implantation still leads to an unacceptable thermal load on the second semiconductor region, as was discussed above, the gas phase epitaxy for forming the second semiconductor region is not carried out until after the third semiconductor region has been formed by means of implantation in the method according to the invention. This is also surprising because in general a diffusion and an implantation (including annealing) are carried out after any gas phase epitaxy. The invention is also partly based on the recognition and the experimental confirmation thereof that the consequence of the above, i.e. that the second semiconductor region lies above the third semiconductor region, does not have any negative consequences for a good operation of the obtained device. This holds irrespective of the conductivity type of the second semiconductor region, which may be equal to or opposed to that of the third semiconductor region. Thanks to this freedom, the barrier of the Schottky junction can be raised as well as lowered, which considerably widens the range over which the current-voltage characteristic can be varied. The devices obtained by the method according to the invention are found to have very well controllable and reproducible properties. As a result of this, and because the method according to the invention is simple, the latter is eminently suitable for mass manufacture of in particular discrete Schottky diodes.

In a first embodiment of a method according to the invention, after the third semiconductor region has been provided in the first semiconductor region, first the second semiconductor region is provided over the entire surface of the semiconductor body by means of non-selective gas phase epitaxy, and subsequently the metal layer is provided by means of non-selective deposition, whereupon the metal layer is removed from outside an edge which lies within the third semiconductor region, as seen in projection. Such a method has the important advantage that it comprises comparatively few steps. The metal layer may be provided in the same piece of equipment in which the second semiconductor region is formed. The devices obtained by this embodiment of the method have excellent properties. A silicon nitride layer may be provided over the surface, with a contact opening therein above the metal layer, by means of a plasma deposition technique for the purpose of passivating the device.

In an embodiment which is also very favourable, after the formation of the first and third semiconductor regions, the surface of the semiconductor body is provided with an electrically insulating layer which is subsequently provided with an opening whose edge, seen in projection, lies within the third semiconductor region, after which the second semiconductor region is provided in said opening by means of selective gas phase epitaxy, and finally the metal layer is deposited over the surface of the semiconductor body and removed again outside an edge which, seen in projection, lies outside the second semiconductor region. Devices with excellent properties are obtained also by means of this embodiment of the method. The method is still comparatively simple, and the devices obtained already have a reasonably good passivation owing to the electrically insulating layer which comprises, for example, silicon dioxide.

In a preferred modification of the latter embodiment, a first electrically insulating layer is provided on the surface of the semiconductor body after the formation of the first semiconductor region, an opening is formed in said layer through which the third semiconductor region is formed, then the portion of the first electrically insulating layer situated within the third semiconductor region is removed, and subsequently a second electrically insulating layer is provided over the surface of the semiconductor body and is provided with the opening in which the second semiconductor region is formed. This modification is also still comparatively simple and combines well with the methods usual in the production of especially Schottky diodes. The devices also have a good passivation. The first and second electrically insulating layers preferably comprise silicon dioxide and silicon nitride, respectively. The former is preferably obtained by means of a thermal oxidation, preferably at a temperature of 1100° C., and the latter is preferably provided by means of an LPCVD (=Low Pressure Chemical Vapor Deposition) technique.

Preferably, a thickness which lies between 5 and 50 nm is chosen for the thickness of the second semiconductor region, preferably a thickness which is approximately 10 nm. Preferably, a doping concentration which lies between $10^{17}$ and $10^{20}$ at/cm$^3$, preferably equal to approximately 1 to $5 \times 10^{18}$ at/cm$^3$, is chosen for the doping concentration of the second semiconductor region. The above domains provide a sufficient freedom in practice for realizing the desired variations in the current-voltage characteristic of the device under manufacture, taking into account both the n-type and the p-type conductivity for the second semiconductor range.

The second region is preferably given a comparatively great thickness and a comparatively high doping concentration with a view to the accuracy and the reproducibility with which this region is provided. A greater thickness implies that either the growing time or the growing temperature must be increased somewhat. This would render the transition between the first and the second region vaguer as a result of diffusion, particularly when the doping concentration of the second region is comparatively high. This is undesirable. The growing rate becomes higher for a given temperature in that a mixture of silicon and germanium is chosen as the material of the second region. The growing time and growing temperature can then be chosen to be as low as possible.

Good results are obtained when the growing temperature is chosen to lie between 625 and 850° C. during the process of providing the second semiconductor region. The best results are obtained at approximately 700° C. The ion implantation by means of which the third semiconductor region is formed is preferably annealed in the temperature range from 850 to 1000° C., and preferably between 900 and 1000° C.

The invention also relates to a semiconductor device manufactured by a method according to the present invention.

BRIEF DESCRIPTION OF THE DRAWINGS

The invention will now be explained with reference to two embodiments and a drawing, in which FIGS. 1 to 5 diagrammatically show a semiconductor device with a Schottky junction in a cross-section taken perpendicular to the thickness direction in consecutive stages of its manufacture by means of a first embodiment of a method according to the invention, FIGS. 1 to 3 and 6 to 9 diagrammatically show a semiconductor device with a Schottky junction in a cross-section taken perpendicular to the thickness direction in consecutive stages of its manufacture by a second embodiment of a method according to the invention.

DESCRIPTION OF THE PREFERRED EMBODIMENTS

Figure 1:
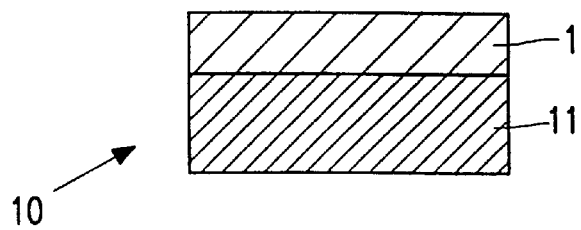
Figure 2:
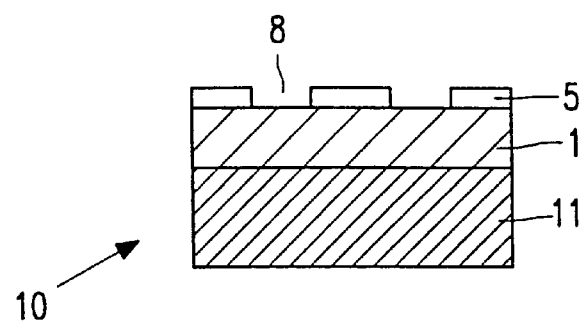
Figure 3:
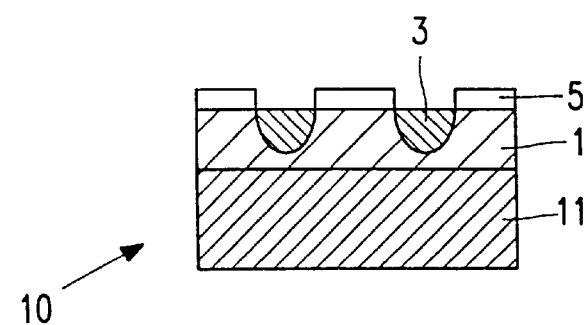
Figure 4:
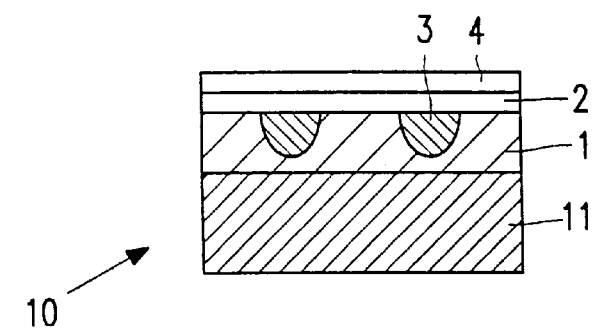
Figure 5:
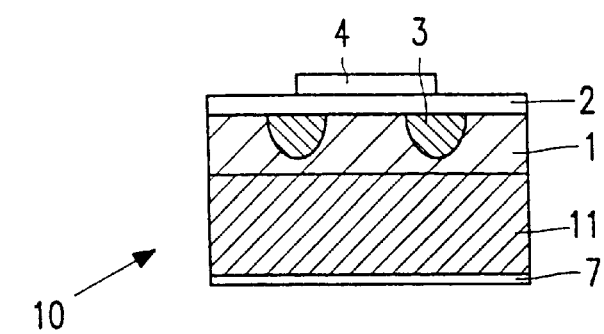
Figure 6:
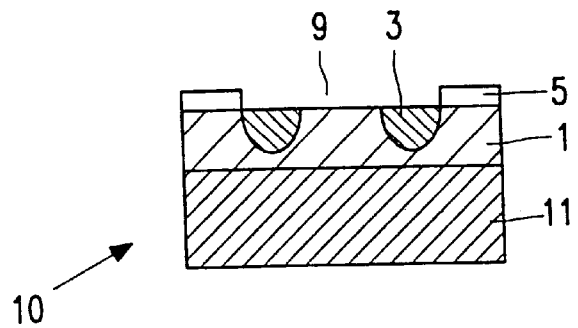

The Figures are not drawn true to scale, the dimensions in the thickness direction being particularly exaggerated for greater clarity. Corresponding regions have been given the same reference numerals as much as possible, and regions of the same conductivity type have been given the same hatching as much as possible.

FIGS. 1 to 5 show a semiconductor device with a Schottky junction diagrammatically and in a cross-section perpendicular to the thickness direction in consecutive stages of its manufacture by a first embodiment of a method according to the invention. The finished device (see FIG. 5) comprises a semiconductor body 10 with a semiconductor substrate 11 on which a stack is formed of a first semiconductor region 1 of a first conductivity type, here the n-type, a second semiconductor region 2, and a metal layer 4 which forms a Schottky junction with the semiconductor body 10. The second semiconductor region 2 has a high doping concentration and a small thickness and forms a region with which the barrier height of the Schottky junction can be adjusted. The semiconductor body 10 further comprises a third semiconductor region 3 of a second conductivity type opposed to the first, i.e. the p-type in this case. The third region 3 surrounds the second region 2 and has a doping concentration and geometry such that edge breakdown is avoided during operation of the Schottky junction. The electrical connections of the device, for example in the form of a wire or solder connection or a conductor track, have not been shown in the drawing.

The device is manufactured as follows by a first embodiment of a method according to the invention. Manufacture starts (see FIG. 1) with a substrate 11 of n-type silicon having a doping concentration of $10^{19}$ at/cm$^3$ and a thickness of 750 μm. On this substrate 11, a first semiconductor region 1 of n-type silicon is formed by means of epitaxy, non-selective gas phase epitaxy in this case at a temperature of 1050° C. The thickness of the region 1 is approximately 8 µm and its doping concentration is $10^{15}$ at/cm$^3$. Then (see FIG. 2) the surface of the semiconductor body 10 is provided with a masking layer 5, here a thermal oxide with a thickness of 650 nm, in which an opening 8, an annular opening here, with an internal diameter of 122 µm and an external diameter of 130 µm, is made by means of photolithography and etching. Subsequently (see FIG. 3), according to the invention, the third, p-type semiconductor region 3 is formed through the opening 8 by means of ion implantation. The implantation, with boron atoms in this case, takes place at an energy level of 40 keV and with a flux of $4 \times 10^{14}$ at/cm$^2$, such that the third semiconductor region is given a thickness of approximately 1 µm. This takes place before the second region 2 is formed, according to the invention. After the implantation, the semiconductor body 10 is annealed for 140 minutes at a temperature of 1050° C. in an atmosphere comprising nitrogen. After removal of the masking layer 5 and a usual cleaning of the semiconductor body 10, the second semiconductor region 2 (see FIG. 4) is formed according to the invention by means of low-temperature gas phase epitaxy. The epitaxial growth takes place by means of a gas mixture of hydrogen and monochloro- or dichlorosilane at a temperature of 700° C. The growing rate under the conditions given is 6 to 7.5 nm/min, and the growing time required for the thickness of 10 nm chosen here accordingly amounts to one to two minutes. The second region 2 is given a doping concentration of approximately $3 \times 10^{18}$ at/cm$^3$ in the growing process. The growing process is non-selective, i.e. the second region 2 covers the entire surface of the semiconductor body 10. The same is true for the metal layer 4 which is subsequently provided and for which an alloy of titanium and tungsten is chosen comprising 10% titanium by weight. The metal layer 4 is deposited in a sputtering process and is subsequently brought into the desired pattern by means of photolithography and etching.

Finally (see FIG. 5), the lower side of the substrate 11 is provided with a metal layer 7, here a mixture of gold and arsenic, which forms an ohmic contact with the substrate 11. Only a single semiconductor device, i.e. a single Schottky junction, is shown in the drawing. It will be obvious, however, that a large number of such devices is obtained simultaneously and that individual devices are obtained from the semiconductor body 10 through separation, for example by means of sawing. The dimensions of a device, square in this case, are 0.1×0.1 mm$^2$. The metal layer 4 is round with a diameter of 126 µm and a thickness of 100 nm.

It is avoided in a method according to the invention that an unacceptably great, uncontrollable and badly reproducible diffusion takes place from the second semiconductor region 2, thanks to the use of the low-temperature gas phase epitaxy for the formation of this second region 2. This is true in particular when a small thickness or a high doping concentration is chosen for the second semiconductor region 2, or when phosphorus ions are implanted therein. The formation of the third semiconductor region 3 by means of ion implantation instead of diffusion also reduces the thermal treatment of the semiconductor body 10 required for forming this third region. This benefits the sharpness of the interface between the epitaxial layer 1 and the substrate 11. Since ion implantation still brings with it an unacceptable thermal load on the second semiconductor region 2, the gas phase epitaxy for forming the second semiconductor region 2 is not carried out, according to the invention, until after the third semiconductor region 3 has been formed by means of implantation. This is an unusual sequence. However, a consequence of the method according to the invention, i.e. that the second semiconductor region 2 is present above the third semiconductor region 3, is found not to detract from a good operation of the device obtained. This is true irrespective of the conductivity type of the second semiconductor region, which is allowed to be equal to as well as opposed to that of the third semiconductor region. This freedom means that the barrier of the Schottky junction can be raised as well as lowered, which considerably widens the range over which the current-voltage characteristic can be varied.

Figure 9:
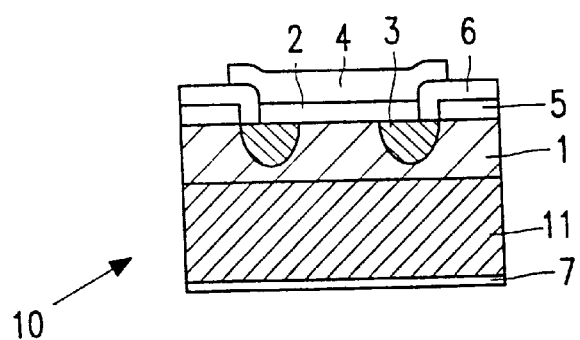

FIGS. 1 to 3 and 6 to 5 show a semiconductor device with a Schottky junction diagrammatically and in a cross-section perpendicular to the thickness direction in consecutive stages of its manufacture by a second embodiment of a method according to the invention. The finished device (see FIG. 9) substantially has the same construction as that of the first embodiment. The discussion thereof with reference to FIG. 5 may be consulted for this again. The main difference is that the second semiconductor region 2 does not extend over the entire surface of the semiconductor body 10 here but is present exclusively above and, seen in projection, within the third semiconductor region 3. Around the second region 2, there is a stack comprising a first insulating layer 5 and a second insulating layer 6 which separate the metal layer 4, in as far as this lies outside the third region 3, from the semiconductor body.

Figure 7:
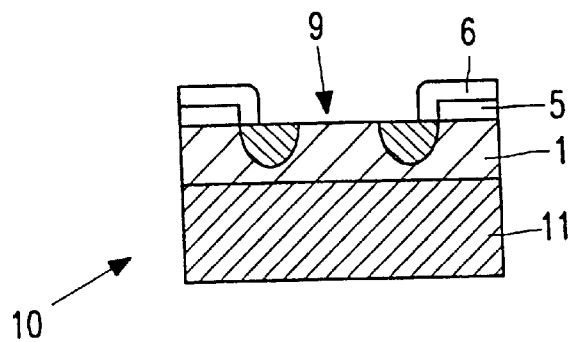
Figure 8:
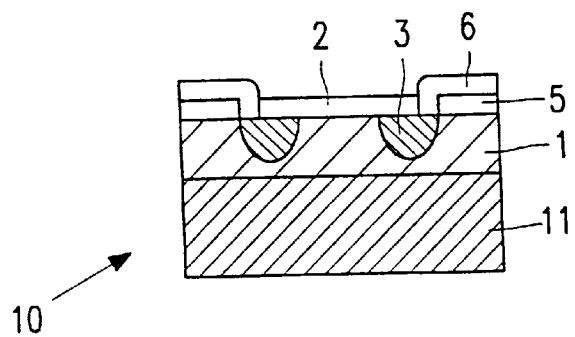

This example of a device is manufactured as follows by a second embodiment of a method according to the invention. The first steps are the same as described for the first embodiment, to which reference is made here, see FIGS. 1 to 3. The inner portion of the first insulating and masking layer 5 is now removed by means of photolithography and etching (see FIG. 6). Then (see FIG. 7) a second electrically insulating layer comprising silicon nitride is provided, by means of LPCVD in this case. This layer 6 is then patterned by means of photolithography and etching, such that the surface of the semiconductor body 10 is exposed within an opening 9. Subsequently (see FIG. 8), according to the invention, the second semiconductor region 2 is formed by means of low-temperature gas phase epitaxy, selective epitaxy in this case. The epitaxial growing process takes place under the same conditions as explained above for the first embodiment. Under these conditions, the second region 2 is formed exclusively within the opening 9 in the first and second insulating layers 5, 6 in this embodiment because no growth takes place on the second insulating layer 6 of silicon nitride. The metal layer 4 (see FIG. 9) is deposited and patterned in the same manner as described for the first embodiment. The metal layer 4 then extends partly over the second insulating layer 6, so that a contact may be readily made thereon. The provision of the conductive layer 7 is also effected in a corresponding manner. The dimensions and compositions of the various regions are chosen to be the same as those of the first embodiment. The thickness of the second insulating layer 6 is 200 nm here. Besides the advantages listed for the first embodiment, this embodiment of the method has the important additional advantage that two Schottky diodes lying side by side may be fully insulated from one another. This renders it easy to manufacture also devices which comprise, for example, two or more Schottky diodes within one semiconductor body. More in particular, this renders it possible to integrate a device according to the invention more easily with other components, for example for forming an integrated circuit.

Figure 10:
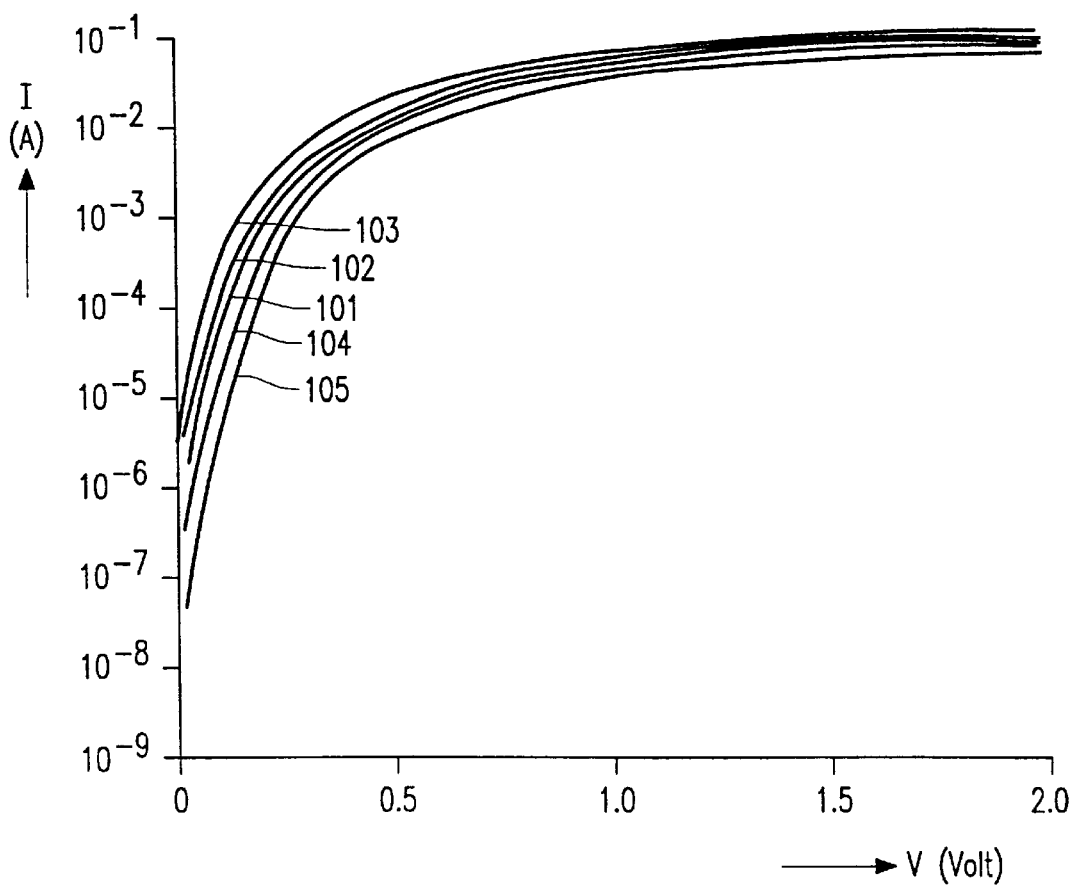
FIG. 10 shows the forward current-voltage characteristics of five semiconductor devices with Schottky junctions, four of which were manufactured by a method according to the invention, while one serves as a reference.

FIG. 10 shows the forward current-voltage characteristics of five semiconductor devices with Schottky junctions, four of which were manufacture by a method according to the invention, while one served as a reference. In the latter device, the second semiconductor region 2 is absent, and the current-voltage characteristic in the forward direction corresponds to curve 101. The other curves represent said characteristics for devices manufactured by a method according to the invention, in which 10 nm was chosen for the thickness of the second semiconductor region 2. The n-conductivity type was chosen for the second semiconductor region 2 in the cases of curves 102 and 103, and the doping concentrations were $1 \times 10^{18}$ and $3 \times 10^{18}$ at/cm$^3$, respectively. Curves 104 and 105 relate to a second semiconductor region for which the p conductivity type was chosen and where the doping concentrations were again $1 \times 10^{18}$ and $3 \times 10^{18}$ at/cm$^3$, respectively. These characteristics render it clear that devices are obtained by a method according to the invention whose current-voltage characteristics are adjustable over a wide range in a simple manner. The reverse currents of the devices at 1 V are 6, 8, 40, 2, and $0.6 \times 10^{-6}$ A in the cases corresponding to curves 101 to 105, respectively, rising evenly and slightly with a rise in voltage. The breakdown voltages are between 50 and 60 V. The barrier was lowered by 13 and 52 meV in the devices corresponding to curves 102 and 103, respectively, and the barriers were raised by 33 and 69 meV in the devices corresponding to curves 104 and 105, respectively.

The invention is not limited to the embodiments given, since many modifications and variations are possible to those skilled in the art within the scope of the invention. Thus thicknesses, (semiconductor) materials, or compositions other than those mentioned in the examples may be used. It is also possible to replace all conductivity types used simultaneously with their opposites.

Instead of a strongly doped semiconductor substrate with an epitaxial layer as the first region, it is also possible to use a weakly doped substrate in which the first region is formed by diffusion. A contact diffusion is then provided for contacting the lower side before the conductive layer is provided.

Several process steps not relevant to the invention may be carried out in an alternative manner; thus an oxide layer obtained by oxidation may alternatively be obtained through deposition from the gas phase or from a plasma.

It is finally noted that the method is not limited to the manufacture of Schottky diodes, whether or not discrete. Thus, for example, MESFETs (=MEtal Semiconductor Field Effect Transistors), again discrete or not, may be manufactured. The gate in such a transistor forms a Schottky junction with the semiconductor body. The third region in that case comprises two sub-regions which form the source and the drain, respectively, of the transistor.

What is claimed is:
1. A method of manufacturing a semiconductor device with a rectifying Schottky junction, comprising a semiconductor body with a semiconductor substrate, by which method a stack is formed in the semiconductor body of a first semiconductor region of a first conductivity type formed by means of epitaxy and a second semiconductor region having a small thickness and a high doping concentration, and by which method a metal layer is provided on the surface of the semiconductor body at the area of the second semiconductor region so as to form the Schottky junction with the semiconductor body, and the thickness and doping concentration of the second semiconductor region are chosen such that the height of the Schottky barrier of the Schottky junction is influenced, while a third semiconductor region of a second conductivity type opposed to the first is provided from the surface of the semiconductor body into the first semiconductor region at at least two mutually opposed sides of the second semiconductor region, characterized in that the second semiconductor regions is formed by means of low-temperature gas phase epitaxy and is given the first or second conductivity type, in that the third semiconductor region is formed by means of ion implantation, and in that the second semiconductor region is formed after the third semiconductor region has been formed.

2. A method as claimed in claim 1, characterized in that the third semiconductor region is provided so as to surround the second semiconductor region entirely and is provided with a doping concentration and a geometry which are such that leakage currents and breakdown at the edge of the Schottky junction are avoided.

3. A method as claimed in claim 1, characterized in that, after the third semiconductor region has been provided in the first semiconductor region, first the second semiconductor region is provided over the entire surface of the semiconductor body by means of non-selective gas phase epitaxy, and subsequently the metal layer is provided by means of non-selective deposition, whereupon the metal layer is removed from outside an edge which lies within the third semiconductor region, as seen in projection.

4. A method as claimed in claim 1, characterized in that, after the formation of the first and third semiconductor regions, the surface of the semiconductor body is provided with an electrically insulating layer which is provided with an opening whose edge, seen in projection, lies within the third semiconductor region, after which the second semiconductor region is provided in said opening by means of selective gas phase epitaxy, and finally the metal layer is deposited over the surface of the semiconductor body and removed again outside an edge which, seen in projection, lies outside the second semiconductor region.

5. A method as claimed in claim 4, characterized in that a first electrically insulating layer is provided on the surface of the semiconductor body after the formation of the first semiconductor region, an opening is formed in said layer through which the third semiconductor region is formed, then the portion of the first electrically insulating layer situated within the third semiconductor region is removed, and subsequently a second electrically insulating layer is provided over the surface of the semiconductor body and is provided with the opening in which the second semiconductor region is formed.

6. A method as claimed in claim 1, characterized in that a thickness which lies between 5 and 50 nm is chosen for the thickness of the second semiconductor region, preferably a thickness which is approximately 10 nm.

7. A method as claimed in claim 1, characterized in that a doping concentration which lies between $10^{17}$ and $10^{20}$ at/cm$^3$, preferably equal to approximately $3 \times 10^{18}$ at/cm$^3$, is chosen for the doping concentration of the second semiconductor region.

8. A method as claimed in claim 1, characterized in that a temperature which lies between 625 and 850° C., and which is preferably approximately 700° C., is chosen as the growing temperature for the second semiconductor region.

9. A method as claimed in claim 1, characterized in that a mixture of silicon and germanium is chosen for the semiconductor material of the second semiconductor region.

10. A semiconductor device manufactured by a method as claimed in claim 1.

* * * * *